(12) United States Patent
Peral et al.

(10) Patent No.: US 7,596,326 B2
(45) Date of Patent: Sep. 29, 2009

(54) DISTORTION CANCELLATION CIRCUITRY FOR OPTICAL RECEIVERS

(75) Inventors: Eva Peral, Altadena, CA (US); Bryon L. Kasper, San Marino, CA (US)

(73) Assignee: Emcore Corporation, Albuquerque, NM (US)

( * ) Notice: Subject to any disclaimer, the term of this patent is extended or adjusted under 35 U.S.C. 154(b) by 580 days.

(21) Appl. No.: 11/262,077

(22) Filed: Oct. 27, 2005

(65) Prior Publication Data

US 2007/0098417 A1 May 3, 2007

(51) Int. Cl.
H04B 10/06 (2006.01)
(52) U.S. Cl. .................................. 398/211; 398/210
(58) Field of Classification Search .............. 398/208, 398/210, 211
See application file for complete search history.

(56) References Cited

U.S. PATENT DOCUMENTS

| | | |
|---|---|---|
| 4,075,474 A | 2/1978 | Straus et al. |
| 4,255,724 A | 3/1981 | Bergero |
| 4,277,763 A | 7/1981 | Ward, Jr. |
| 4,633,197 A | 12/1986 | Vanderspool, II |
| 4,700,151 A | 10/1987 | Nagata |
| 4,752,743 A | 6/1988 | Pham et al. |
| 4,890,300 A | 12/1989 | Andrews |
| 4,902,983 A | 2/1990 | Fujiki et al. |
| 4,992,754 A | 2/1991 | Blauvelt et al. |
| 5,038,113 A | 8/1991 | Katz et al. |
| 5,049,832 A | 9/1991 | Cavers |
| 5,113,068 A | 5/1992 | Burke, Jr. |
| 5,132,639 A | 7/1992 | Blauvelt et al. |
| 5,138,275 A | 8/1992 | Abbiati et al. |
| 5,146,177 A | 9/1992 | Katz et al. |
| 5,161,044 A | 11/1992 | Nazarathy et al. |
| 5,239,402 A * | 8/1993 | Little et al. .................. 398/202 |
| 5,252,930 A | 10/1993 | Blauvelt |
| 5,321,710 A | 6/1994 | Cornish et al. |
| 5,342,389 A | 8/1994 | Haber et al. |
| 5,363,056 A | 11/1994 | Blauvelt |
| 5,373,384 A | 12/1994 | Hebert |
| 5,378,937 A | 1/1995 | Heidemann et al. |
| 5,381,108 A | 1/1995 | Whitmarsh et al. |
| 5,418,637 A | 5/1995 | Kuo |

(Continued)

FOREIGN PATENT DOCUMENTS

EP    0 370 608    5/1990

(Continued)

OTHER PUBLICATIONS

Tsz Yun Yum, Quan Xue, Chi Hou Chan, "A Novel Amplifier Linearization Technique Using an Anti-Parallel Reconfigurable Transistor (ART) Pair", Wireless Communications Research Center, City University of Hong Kong, IEEE 2004 MTT-S Digest, pp. 685-688.

(Continued)

Primary Examiner—Nathan M Curs

(57) ABSTRACT

An optical receiver having a photodetector coupled to an external optical fiber for receiving an optical communications signal and converting it into an electrical signal; an RF amplifier coupled to the electrical output of the photodetector and generating an output signal with distortion; and a post-distortion circuit connected to the output of the RF amplifier for canceling the distortion in the output signal produced by the RF amplifier.

9 Claims, 6 Drawing Sheets

U.S. PATENT DOCUMENTS

| | | | |
|---|---|---|---|
| 5,424,680 A | 6/1995 | Nazarathy et al. | |
| 5,428,314 A | 6/1995 | Swafford et al. | |
| 5,430,568 A | 7/1995 | Little et al. | |
| 5,430,569 A | 7/1995 | Blauvelt et al. | |
| 5,436,749 A | 7/1995 | Pidgeon, Jr. et al. | |
| 5,453,868 A | 9/1995 | Blauvelt et al. | |
| 5,477,367 A | 12/1995 | van der Heijden | |
| 5,481,389 A * | 1/1996 | Pidgeon et al. | 398/208 |
| 5,523,716 A | 6/1996 | Grebliunas et al. | |
| 5,589,797 A | 12/1996 | Gans et al. | |
| 5,600,472 A * | 2/1997 | Uesaka | 398/158 |
| 5,606,286 A | 2/1997 | Bains | |
| 5,699,179 A | 12/1997 | Gopalakrishnan | |
| 5,768,449 A | 6/1998 | Fuse et al. | |
| 5,798,854 A | 8/1998 | Blauvelt et al. | |
| 5,812,294 A | 9/1998 | Wilson | |
| 5,850,305 A | 12/1998 | Pidgeon | |
| 5,852,389 A | 12/1998 | Kumar et al. | |
| 5,939,920 A | 8/1999 | Hiraizumi | |
| 5,963,352 A | 10/1999 | Atlas et al. | |
| 6,018,266 A | 1/2000 | Wu | |
| 6,055,278 A | 4/2000 | Ho et al. | |
| 6,061,161 A * | 5/2000 | Yang et al. | 398/194 |
| 6,122,085 A | 9/2000 | Bitler | |
| 6,133,790 A | 10/2000 | Zhou | |
| 6,144,706 A | 11/2000 | Sato et al. | |
| 6,204,718 B1 | 3/2001 | Pidgeon, Jr. | |
| 6,232,836 B1 | 5/2001 | Zhou | |
| 6,255,908 B1 | 7/2001 | Ghannouchi et al. | |
| 6,278,870 B1 | 8/2001 | Davie et al. | |
| 6,288,814 B1 | 9/2001 | Blauvelt | |
| 6,313,701 B1 | 11/2001 | Mussino et al. | |
| 6,388,470 B1 * | 5/2002 | Mattos et al. | 326/81 |
| 6,519,374 B1 | 2/2003 | Stook et al. | |
| 6,542,037 B2 | 4/2003 | Noll et al. | |
| 6,549,316 B2 | 4/2003 | Blauvelt | |
| 6,570,430 B1 | 5/2003 | Zhou | |
| 6,724,253 B2 | 4/2004 | Hau et al. | |
| 6,806,778 B1 | 10/2004 | Kobayashi | |
| 6,946,908 B1 | 9/2005 | Sun et al. | |
| 6,985,020 B2 | 1/2006 | Zhou | |
| 7,340,184 B2 * | 3/2008 | Frederiksen et al. | 398/198 |
| 2005/0195038 A1 * | 9/2005 | Neenan et al. | 330/308 |
| 2006/0034622 A1 * | 2/2006 | Day | 398/208 |

FOREIGN PATENT DOCUMENTS

| | | |
|---|---|---|
| EP | 0524758 A2 | 1/1993 |
| EP | 0620661 | 10/1994 |
| EP | 1732209 A1 | 12/2006 |
| JP | 10126284 | 5/1998 |
| WO | WO9532561 | 11/1995 |
| WO | WO 01/43278 A1 | 6/2001 |

OTHER PUBLICATIONS

Yong-Joon Jeon, Hyung-Wook Kim, Min-Seok Kim, Young-Sik Ahn, Jong-Won Kim, Ji-Youn Choi, Doo-Chan Jung, Jin-Ho Shin, "Improved HBT Linearity With a 'Post-Distortion'-Type Collector Linearizer" IEEE Microwave and Wireless Components Letters, vol. 13, No. 3, Mar. 2003, pgs.

MO1B-2; A Quad 2.7 Gb/s Parallel Optical Transceiver; By J. Ahadian et al.; pp. 13-16; Year 2004.

8100 IEEE Transactions On Nuclear Science; No. 2, New York; A Monolithically Integrated Detector-Preamplifier On High-Resistivity Silicon; By S. Holland et al.; pp. 463-468; Apr. 1990.

Journal of Solid-State Circuits, vol. 39, No. 8; Bandwidth Enhancement For Transimpedance Amplifiers; By Beham Analui et al.; pp. 1263-1270; Aug. 2004.

* cited by examiner

DISTORTION CANCELLATION CIRCUITRY FOR OPTICAL RECEIVERS

REFERENCE TO RELATED APPLICATIONS

This application is related to U.S. patent application Ser. No. 11/148,022 filed Jun. 9, 2005, and assigned to the common assignee.

BACKGROUND OF THE INVENTION

1. Field of the Invention

The invention relates to optical receivers, and in particular to RF amplifiers that have a non-linear operating characteristic and interface between a photodiode that receives an optical signal from an optical fiber, such as used in fiber optical communications links, and electronic network terminal units.

2. Description of the Related Art

A variety of optical communications systems are known in the art which include an optical transmit portion that converts an electrical signal into an optical signal launched into an optical fiber, and a receive portion that receives an optical signal from the optical fiber and converts it into an electrical signal. Traditionally, optical receive sections include an optical assembly to focus or direct the light from the optical fiber onto a photodetector, which in turn, is connected to an amplifier/limiter circuit on a circuit board. The photodetector or photodiode is typically packaged in a hermetically sealed package in order to protect it from harsh environmental conditions. The photodiodes are semiconductor chips that are typically a few hundred microns to a couple of millimeters wide and 100-500 microns thick. The package in which they are mounted is typically from three to six millimeters in diameter, and two to five millimeters tall and has several electrical leads coming out of the package. These electrical leads are then soldered to the circuit board containing the amplifier/limiter and other circuits for processing the electrical signal.

Fiber optic transmission has been used for many years for the distribution of analog CATV signals. Optical receivers for analog CATV signals typically consist of a packaged photodiode electrically connected to a separately-packaged low-noise electronic amplifier, with the photodiode package usually consisting of a TO can with an optical window cap of a ball lens cap to allow light from an optical fiber to be coupled to the photodiode.

A disadvantage of the above arrangement is that there are significant parasitic capacitances associated with the separate photodiode and electronic amplifier packages. These parasitic capacitances play a role in limiting the performance of the optical receiver, resulting in lower bandwidth and higher noise, and contributing to higher power dissipation required to meet a particular target specification.

Distribution of analog CATV signals is particularly challenging because of the high degree of linearity required to obtain adequate quality. Two techniques have been employed previously to obtain this level of low electrical distortion.

Operating the amplifying transistors with high quiescent currents and voltages so that the signal swing is limited to a small fraction of the available current or voltage excursion. These high quiescent voltages and currents lead to high DC power dissipation.

Use of a push-pull or balanced amplifiers, which cancel even-order distortion products are also known. Push-pull amplifiers also come at the price of higher power dissipation, however, because two amplifiers are needed instead of just one single-ended amplifier, and also at the price of balanced-to-unbalanced transformers needed to interconnect to later single-ended stages.

Another technique that has been used in CATV systems is pre-distortion. Here an electrical signal is generated prior to the nonlinear element such that it cancels the distortion of the nonlinear element. This has been mainly applied to linearize lasers.

For new Fiber-to-the-Home applications that include an analog optical CATV receiver at each customer premise, there is a strong desire on the part of system suppliers and operating companies to reduce power dissipation and to lower device cost.

SUMMARY OF THE INVENTION

1. Objects of the Invention

It is an object of the present invention to provide an optical receiver with distortion cancellation for use with optical network system units such as receivers and transceivers.

It is also another aspect of the present invention to provide a distortion cancellation circuit for use in non-linear amplifiers used in analog RF transmission systems.

2. Features of the Invention

Briefly, and in general terms, the present invention provides an optical receiver for converting and coupling an information-containing optical signal from an optical fiber, including a photodiode subassembly in the housing for converting an optical signal into a modulated electrical signal corresponding to the optical signal; and an amplifier including a distortion cancellation circuit.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein with respect to which the invention could be of utility.

BRIEF DESCRIPTION OF THE DRAWINGS

These and other features of the present invention will be better understood and more fully appreciated by reference to the following detailed description when considered in conjunction with the accompanying drawings, wherein.

DETAILED DESCRIPTION OF THE INVENTION

The first amplification stage of an optical receiver usually consists of a transimpedance amplifier, also known as TIA, such that the receiver noise is minimized. In order to achieve high linearity and low electrical distortion required for analog applications, the amplifying transistors are operated with high quiescent currents and voltages so that the signal swing is limited to a small fraction of the available current or voltage excursion. These high quiescent voltages and currents lead to the high DC powerdissipation of analog TIAs.

Figure 1:
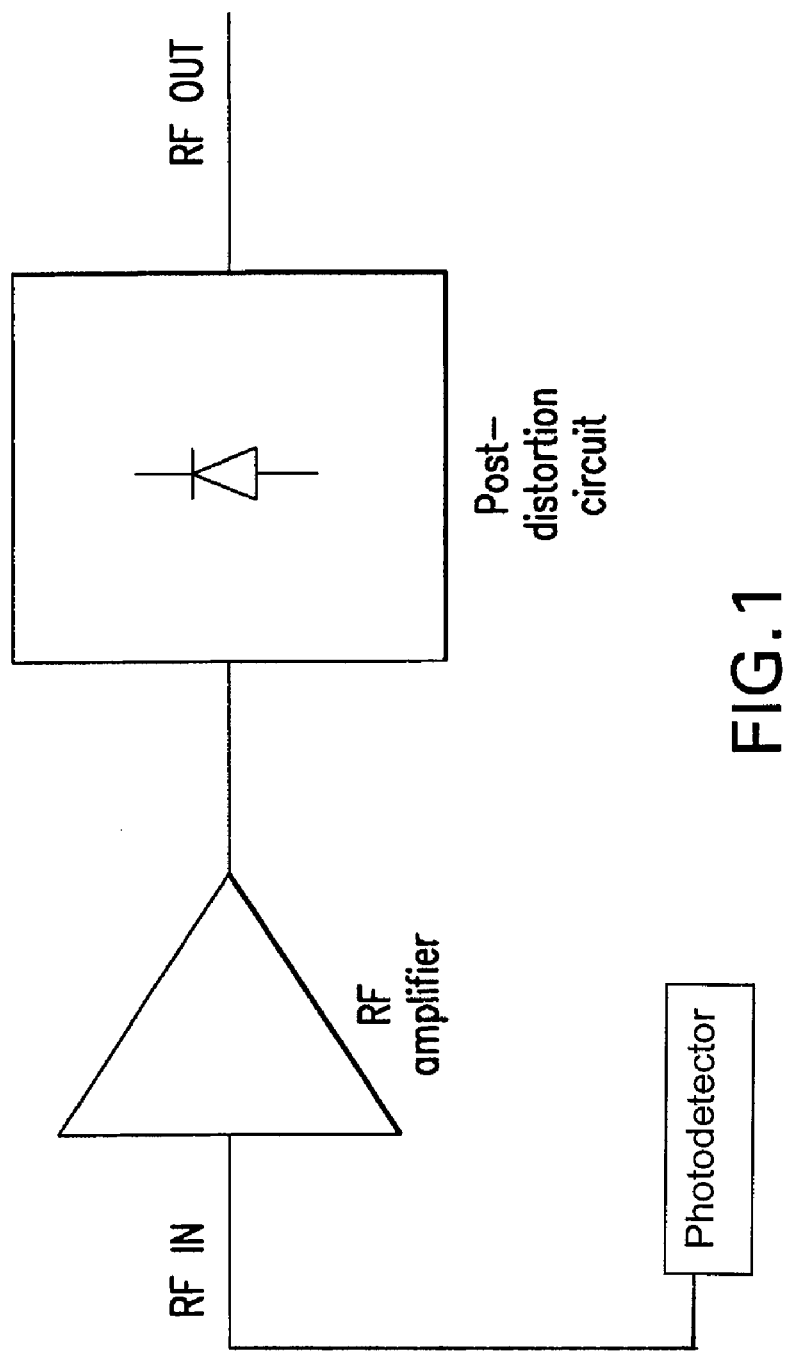
FIG. 1 is a block diagram of an amplifier in an exemplary embodiment in accordance with the present invention.

A block diagram of this invention is shown in FIG. 1. It consists of a nonlinear device (in this case RF amplifier, but it would also apply to an optical receiver) followed by a post-distortion circuit that generates distortion such as to cancel the distortion from the previous nonlinear device. In the case of an amplifier, this could be a single-ended amplifier with only one transistor, with low DC operating current and low supply voltage. In the case of an optical receiver, the circuit could also include a photodiode operating from a low supply voltage.

When operated with low quiescent voltages and/or currents, the amplifying transistors produce distortion, which can be both real and imaginary. One or various post-distortion circuits can be added after the amplification stage to cancel the distortion. Real distortion is typically cancelled with Schottky diodes. Imaginary distortion is typically cancelled using varactor diodes, or adding reactive components to the Schottky diode circuits. Reactive components can also be added to the post-distortion circuits in order to alter the frequency dependence of the distortion. The quiescent voltages and/or currents of the amplifying transistors can also be adjusted in order to match the magnitude, phase and frequency content of the distortion generated by the post-distortion circuit. Circuits that generate second order distortion typically generate third order distortion as well. The circuits can be designed so that both second order and third order distortion is cancelled simultaneously. Alternatively, one can design a circuit in a push-pull configuration that only cancels third order distortion and a separate circuit to cancel second order distortion.

The amplifier and post-distortion circuit can be packaged together with the photodiode in order to reduce parasitics. Alternatively, either the post-distortion circuit or both amplifier and post-distortion circuits can be mounted outside the photodiode package on a circuit board.

There is a distinct advantage in using post-distortion rather than pre-distortion when correcting the distortion of a small-signal amplifier. Since the input power to the distortion circuit is higher, large levels of correction are easier to achieve with low loss. In the case of an optical receiver, you can only use post-distortion as the input signal levels are too low for pre-distortion to work.

Figure 2:
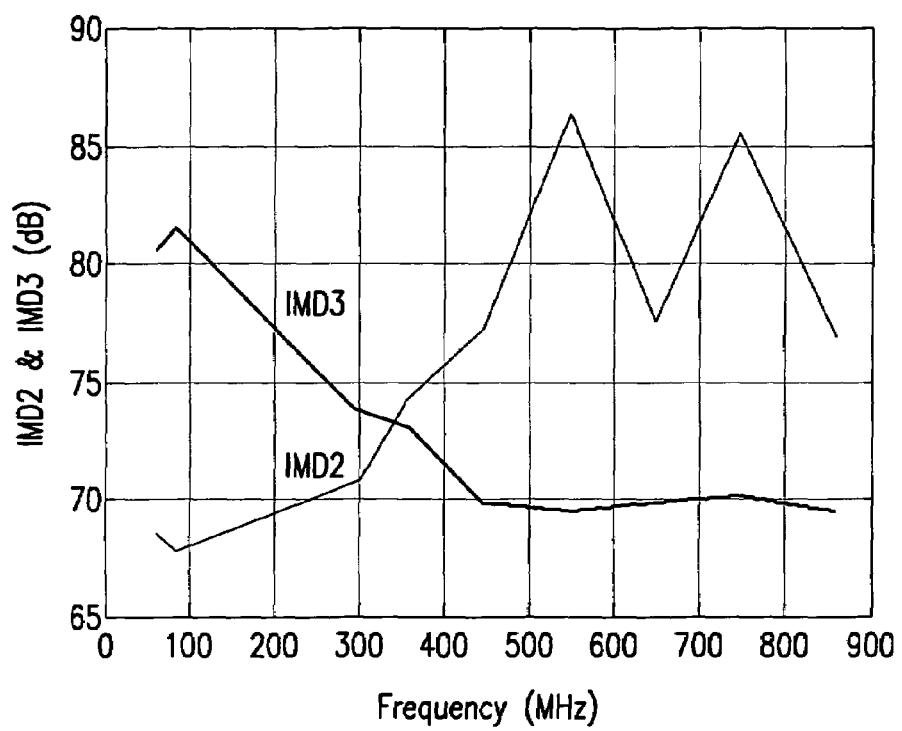
FIG. 2 is a graph of the distortion of an optical receiver with a single diode distortion cancellation circuit in an exemplary embodiment in accordance with the present invention.

FIG. 2 shows a demonstration of a TIA in PHEMPT technology according to the present invention. The results show second order distortion (IMD2) and third order distortion (IMD3) using a two tone test with laser modulation index 40% and total optical input power 1 dBm.

Figure 3:
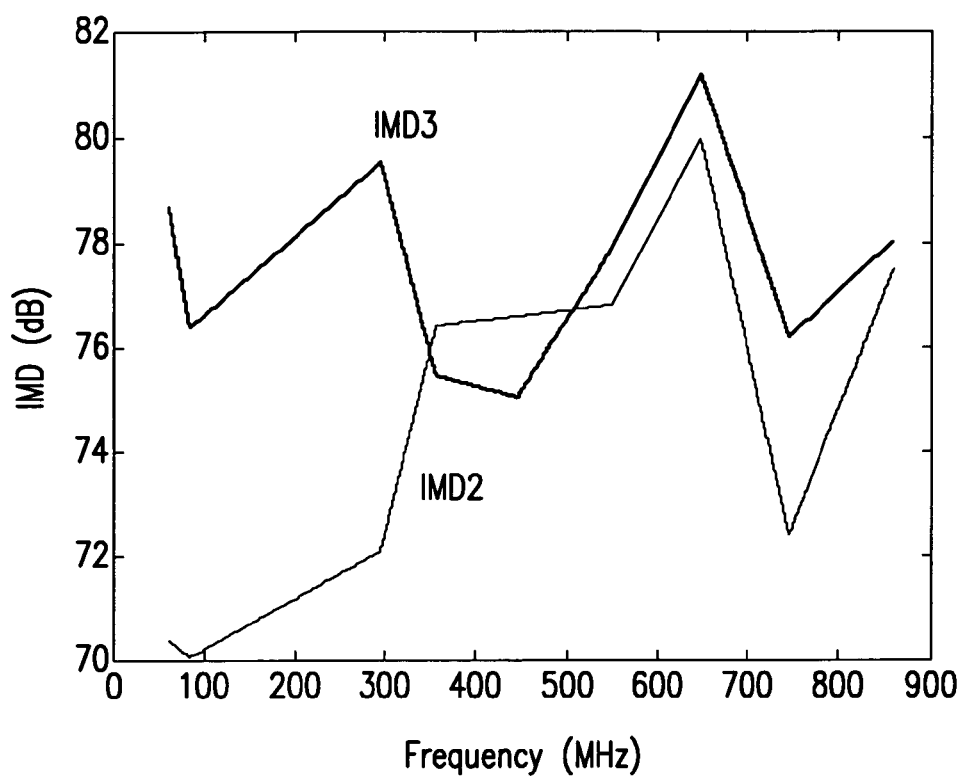
FIG. 3 is a graph of the distortion of an amplifier with a single diode post-distortion cancellation circuit in an exemplary embodiment in accordance with the present invention.

FIG. 3 shows distortion for an amplifier with post-distortion according to the present invention.

Figure 4:
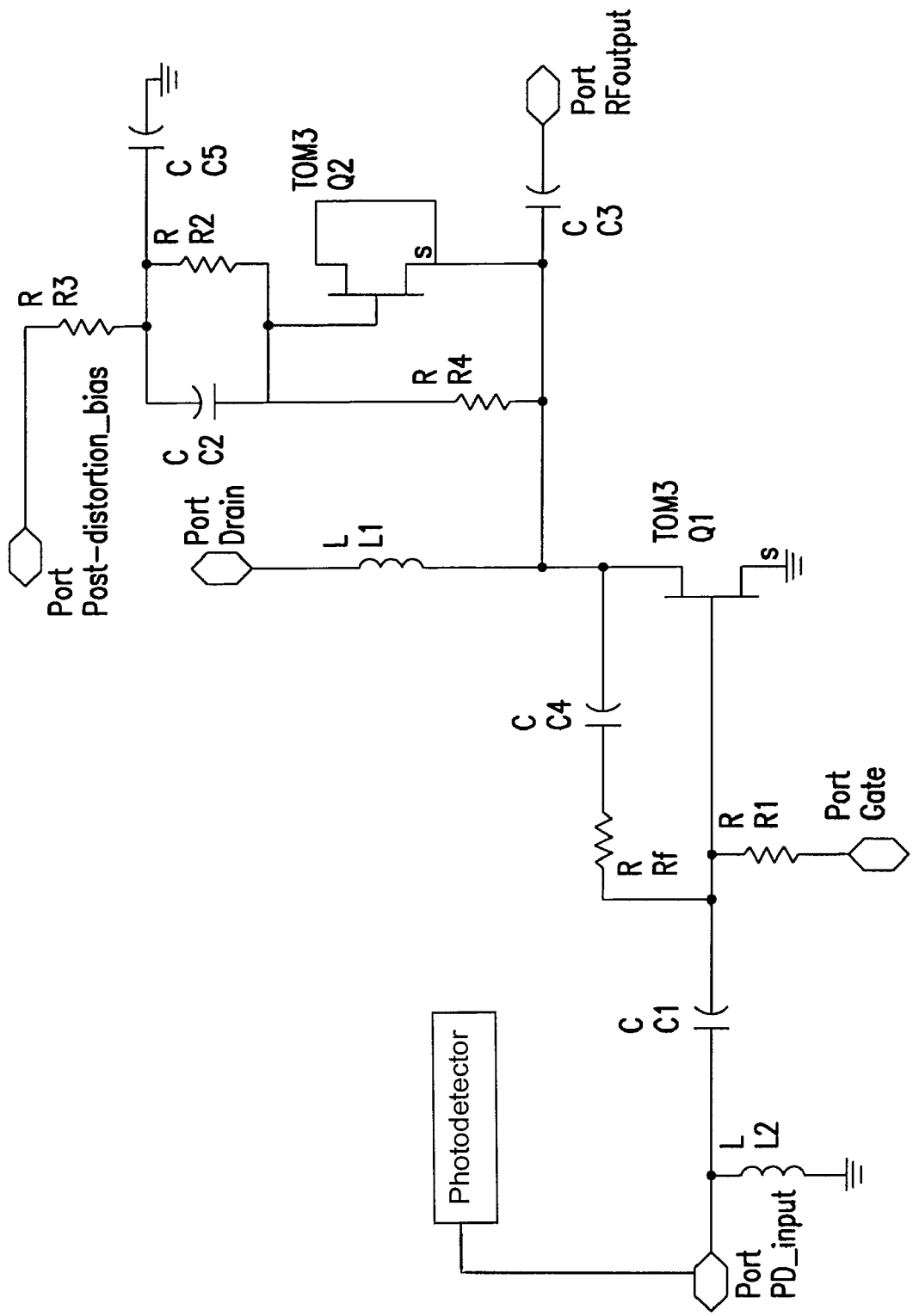
FIG. 4 is an exemplary embodiment of the present invention as an integrated circuit in PHEMT technology.

FIG. 4 is an exemplary embodiment of an optical receiver according to the present invention. Both amplifier and post-distortion sections could be combined in an IC using PHEMT technology for low cost and high performance.

The amplification stage is represented by transistor Q1. In this embodiment, the postdistortion stage merely consists of transistor Q2 acting as a Schottky diode. Resistor R4 is added in order to reduce the third order distortion generated by the postdistortion circuit, which could be undesirable. Resistor R2 controls the amount of postdistortion generated by the circuit, and capacitor C2 is used to adjust the phase of the distortion. The amount of second and third order distortion is also controlled by adjusting the postdistortion bias voltage.

Figure 5:
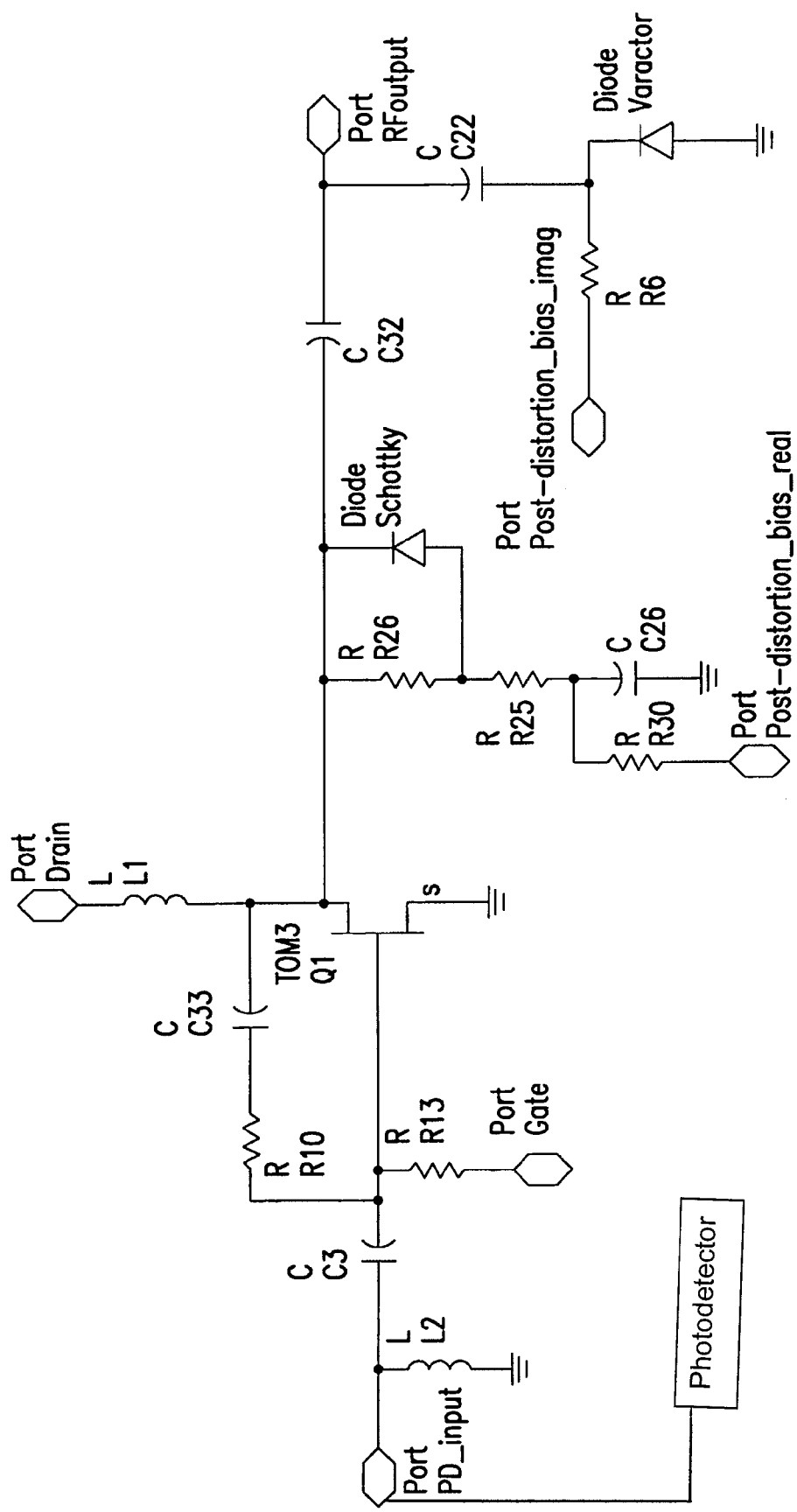
FIG. 5 is a block diagram of the present invention using two circuits to achieve cancellation of real and imaginary distortion.

FIG. 5 is another exemplary embodiment of an optical receiver according to the present invention. In this case the postdistortion circuit consists of a Schottky diode and a varactor diode, so as to provide flexible cancellation of real and imaginary distortion as described previously. If the real part of the amplifier distortion is negative, then the cathode terminal of the Schottky diode should be connected to the main transmission path, as shown in FIG. 5. If the real part of the amplifier distortion is positive, then the anode terminal of the Schottky diode should be connected to the main transmission path. If the imaginary part of the amplifier distortion is negative, then the cathode terminal of the varactor diode should be connected to capacitor C22, as shown in FIG. 5. If the imaginary part of the amplifier distortion is positive, then the anode terminal of the varactor diode should be connected to capacitor C22.

Figure 6:
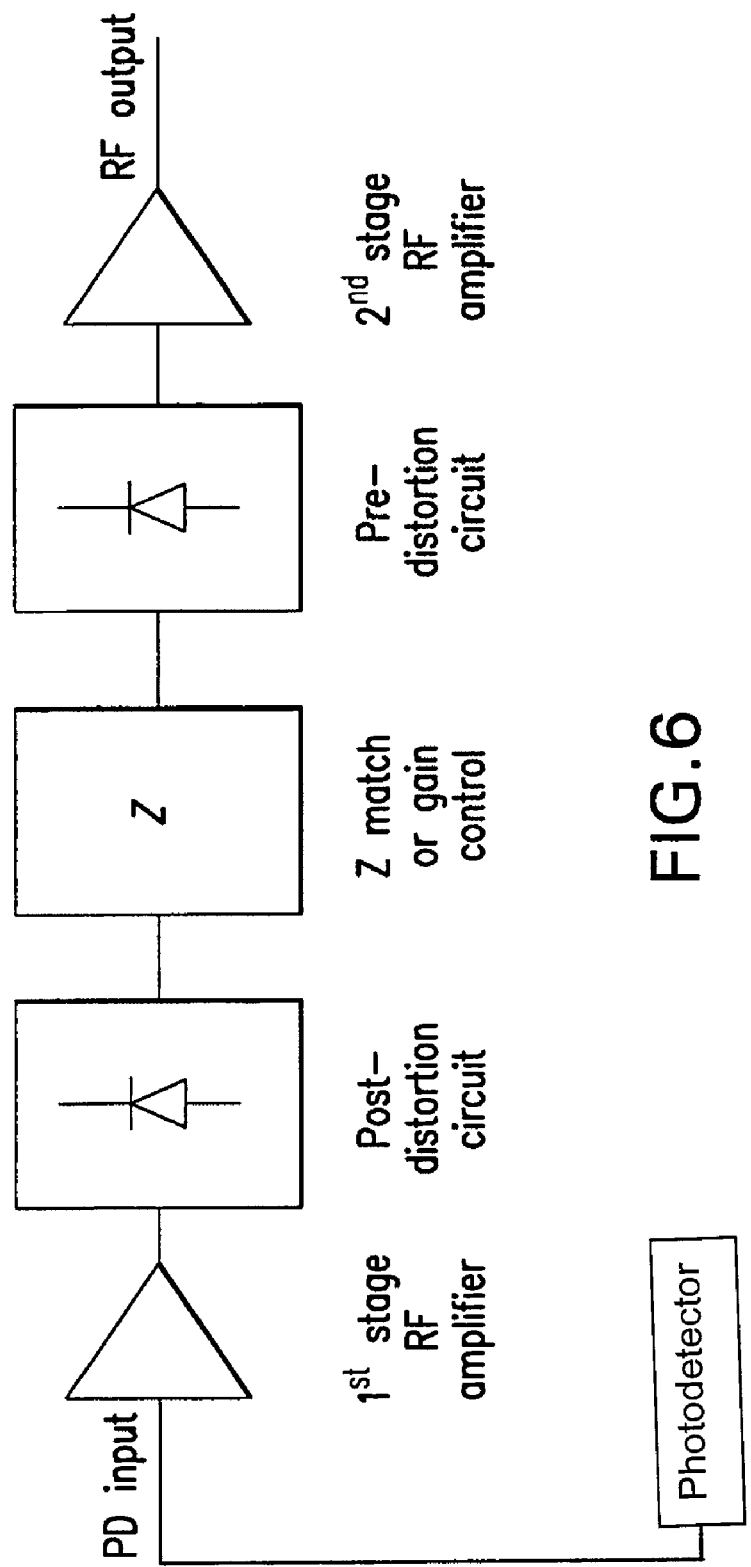
FIG. 6 is an exemplary embodiment of the present invention with two stages of amplification.

FIG. 6 is yet another exemplary block diagram of an optical receiver according to the present invention. The first amplification stage follows the photodiode, and uses post-distortion to correct for the distortion, i.e. the correction circuit follows the amplification circuit. The first amplification stage and post-distortion circuits could possibly correspond to circuits presented in either FIG. 4 or 5. The final amplification stage uses pre-distortion, i.e. the correction circuit goes prior to the amplification circuit. Between these amplification stages there might be an additional stage for impedance matching and/or gain control. Additional amplification stages can me added for higher gain, either with pre- or post-distortion.

Even though this invention has been described within the context of CATV and FTTX applications, it could benefit many other applications that might require highly linear RF and/or optoelectronic components such as, but not limited to, satellite communications, radar systems and military applications.

What is claimed is:

1. An optical receiver comprising:
    a photodetector coupled to an external optical fiber for receiving an optical communications signal and converting it into an electrical signal;
    a single ended RF amplifier with only one transistor coupled to the electrical output of the photodetector and generating an output signal with distortion;
    a first inductor coupled to a first capacitor coupled to an input of the single ended RF amplifier;
    a second inductor coupled to an output of the single ended RF amplifier;
    a resistor having a first terminal and a second terminal, the first terminal being coupled to the input of the single ended RF amplifier;
    a second capacitor having a first terminal and a second terminal, the first terminal being coupled to the second terminal of the resistor and the second terminal being coupled to the output of the single ended RF amplifier; and
    a post-distortion circuit including a Schottky diode connected to the output of the RF amplifier for canceling the distortion in the output signal produced by the RF amplifier, wherein the single ended RF amplifier and the post-distortion circuit are in a single package.

2. An optical receiver as defined in claim 1, wherein the single package is formed by an integrated chip (IC).

3. An optical receiver as defined in claim 1, wherein the post-distortion circuit for canceling distortion further includes a varactor diode.

4. An optical receiver as defined in claim 1, wherein the post-distortion circuit for canceling distortion includes a transistor.

5. An optical receiver as defined in claim 1, wherein the post-distortion circuit for canceling distortion includes at least a resistor and a capacitor for adjusting magnitude, and phase content of the distortion generated by the RF amplifier.

6. An optical receiver as defined in claim 1, further comprising means for adjusting a DC operating point of a nonlinear device in order to tune the distortion.

7. An optical receiver as defined in claim 1, wherein the post-distortion circuit cancels both second and third order distortion.

8. An optical receiver as defined in claim 1, wherein the single ended RF amplifier is followed by one or more amplification stages using pre and/or post-distortion.

9. An optical receiver as defined in claim 1, wherein the single package includes a first port coupled to the first inductor for the input of the single ended RF amplifier, a second port for a gate of the only one transistor, a third port coupled to the second inductor for a drain of the only one transistor, a fourth port for a bias voltage coupled to the Schottky diode, and a fifth port for an output of the post-distortion circuit.

* * * * *